United States Patent
Terao (10) Patent No.: US 9,876,188 B2
(45) Date of Patent: Jan. 23, 2018

(54) LIGHT EMITTING ELEMENT AND METHOD OF MANUFACTURING LIGHT EMITTING ELEMENT

(71) Applicant: PIONEER CORPORATION, Kawasaki-shi, Kanagawa (JP)

(72) Inventor: Yuhki Terao, Kawasaki (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/108,257

(22) PCT Filed: Dec. 27, 2013

(86) PCT No.: PCT/JP2013/085219
§ 371 (c)(1),
(2) Date: Jun. 24, 2016

(87) PCT Pub. No.: WO2015/097894
PCT Pub. Date: Jul. 2, 2015

(65) Prior Publication Data
US 2016/0322593 A1    Nov. 3, 2016

(51) Int. Cl.
*H01L 51/50* (2006.01)
*H01L 51/52* (2006.01)
*H01L 51/56* (2006.01)

(52) U.S. Cl.
CPC ...... *H01L 51/5092* (2013.01); *H01L 51/5076* (2013.01); *H01L 51/5203* (2013.01); *H01L 51/56* (2013.01)

(58) Field of Classification Search
CPC .................................................. H01L 51/5092
See application file for complete search history.

(56) References Cited

U.S. PATENT DOCUMENTS 6,753,648 B2   6/2004   Boffito et al.
7,625,505 B2   12/2009  Cattaneo et al.
(Continued)

FOREIGN PATENT DOCUMENTS

EP    1 418 250      5/2004
JP    2004-137583    5/2004
(Continued)

OTHER PUBLICATIONS

International Search Report for PCT App No. PCT/JP2013/085219 dated Apr. 8, 2014, 5 pgs.

*Primary Examiner* — Daniel Whalen
*Assistant Examiner* — Suberr Chi
(74) *Attorney, Agent, or Firm* — Procopio, Cory, Hargreaves & Savitch LLP (57) ABSTRACT

A second electrode (130) is superimposed on a first electrode (110). An organic layer (120) is positioned between the first electrode (110) and the second electrode (130). Furthermore, the organic layer (120) includes a light emitting layer (123). Furthermore, the organic layer (120) includes an alkali-containing layer (which is an electron transporting layer (125) in an example in the present drawing, and is hereinafter described as the electron transporting layer (125)) between the light emitting layer (123) and the second electrode (130). The electron transporting layer (125) includes an alkali metal. In the electron transporting layer (125), a content of the alkali metal as an elemental substance is greater than the content of a compound of the alkali metal.

4 Claims, 8 Drawing Sheets

(56) References Cited

U.S. PATENT DOCUMENTS

| | | |
|---|---|---|
| 7,794,630 B2 | 9/2010 | Cattaneo et al. |
| 2004/0001916 A1 | 1/2004 | Boffito et al. |
| 2004/0206205 A1 | 10/2004 | Boffito et al. |
| 2008/0042102 A1 | 2/2008 | Cattaneo et al. |
| 2009/0066223 A1 | 3/2009 | Yabe et al. |
| 2010/0021623 A1 | 1/2010 | Cattaneo et al. |
| 2011/0042662 A1 | 2/2011 | Morishima |
| 2011/0090207 A1* | 4/2011 | Yamazaki ............ H01L 27/1225 345/211 |
| 2011/0215312 A1 | 9/2011 | Yabe et al. |

FOREIGN PATENT DOCUMENTS

| | | |
|---|---|---|
| JP | 2004-532932 | 10/2004 |
| JP | 2008-512570 | 4/2008 |
| JP | 2009-246126 | 10/2009 |
| WO | 2006/013739 | 2/2006 |
| WO | 2006/095539 | 9/2006 |

* cited by examiner

| CESIUM COMPOUND | METHOD OF VAPOR-DEPOSITING CESIUM COMPOUND | LUMINANCE $cd/m^2$ | DRIVE VOLTAGE V |
|---|---|---|---|
| CESIUM TITANATE | E B | 6 5 1 | 3. 7 7 |
| CESIUM ZIRCONATE | E B | 6 7 8 | 3. 7 3 |
| CESIUM TITANATE | RESISTANT HEATING | 6 5 2 | 3. 7 5 |
| CESIUM ZIRCONATE | RESISTANT HEATING | 6 8 2 | 3. 8 0 |
| CESIUM MOLYBDATE | E B | 5 5 1 | 4. 0 6 |
| CESIUM MOLYBDATE | RESISTANT HEATING | 6 4 5 | 3. 6 3 |
| CESIM TUNGSTATE | E B | 6 7 7 | 4. 0 5 |
| CESIM TUNGSTATE | RESISTANT HEATING | 6 5 1 | 3. 6 2 |

LIGHT EMITTING ELEMENT AND METHOD OF MANUFACTURING LIGHT EMITTING ELEMENT

This is a National Stage entry of PCT/JP2013/085219, filed on Dec. 27, 2013, claiming benefit under 35 USC §371.

TECHNICAL FIELD

The present invention relates to a light emitting element and a method of manufacturing the light emitting element.

BACKGROUND ART

In recent years, advancement is seen in the development of a light emitting device using, as the light source, an organic EL element which is employed as a light emitting element. An organic layer of the organic EL element has a configuration in which a hole injection layer, a light emitting layer, and an electron injection layer are stacked on top of one another.

Patent Document 1 discloses that an electron injection layer includes a salt of an acid of one or more types of metals that are selected from the group consisting of molybdenum, tungsten, vanadium, tantalum, titanium, and group IIb elements, with one or more types of alkali metals that are selected from the group consisting of potassium, rubidium, and cesium.

Patent Document 2 discloses that an electron injection layer includes at least one kind of an alkali metal, an alkaline earth metal, or salts thereof.

RELATED DOCUMENT

Patent Document

[Patent Document 1] Japanese Unexamined Patent Application Publication No. 2009-246126
[Patent Document 2] International Publication No. WO 2006/013739

SUMMARY OF THE INVENTION

An improvement in light emitting efficiency of the light emitting element is in demand. One method of improving the light emitting efficiency is to suppress resistance between a light emitting layer and an electrode.

An exemplary object of the present invention for solving the problem described above is to improve light emitting efficiency of a light emitting element by improving a layer between a light emitting layer and an electrode.

An invention according to claim 1 is a light emitting element including: a first electrode; a second electrode; and an organic layer that is positioned between the first electrode and the second electrode, the organic layer including a light emitting layer and an alkali-containing layer that contains an alkali metal between the light emitting layer and the second electrode, and in the alkali-containing layer, a content of the alkali metal as an elemental substance or a content of a compound of the alkali metal that is different from a first compound containing a transition metal being greater than a content of the first compound.

An invention according to claim 2 is a light emitting element including: a first electrode; a second electrode that is superimposed on the first electrode; and an organic layer that is positioned between the first electrode and the second electrode, the organic layer including a light emitting layer and further an alkali-containing layer positioned between the light emitting layer and the second electrode that contains an alkali metal, and the alkali metal in the alkali-containing layer being composed of the alkali metal as an elemental substance or a compound of the alkali metal which is different from a compound containing a transition metal.

An invention according to claim 6 is a method of manufacturing a light emitting element, including: forming a first electrode on a substrate; forming an organic layer including a light emitting layer, on the first electrode; and forming a second electrode on the organic layer, the organic layer including the light emitting layer and an alkali-containing layer that contains an alkali metal between the light emitting layer and the second electrode, and the alkali-containing layer being formed using an electron beam vapor deposition method in which a cesium compound is used as a material.

BRIEF DESCRIPTION OF THE DRAWINGS

The objects described above, and other objects, features and advantages are further made apparent by suitable embodiments that will be described below and the following accompanying drawings.

FIGS. 2 (a) and (b) are charts illustrating a result of an XPS analysis of an electron transporting layer that is performed when cesium titanate is vapor-deposited using an electron beam method.

FIGS. 3 (a) and (b) are charts illustrating a result of the XPS analysis of the electron transporting layer that is performed when cesium titanate is vapor-deposited using a resistant heating method.

FIGS. 4 (a) and (b) are charts illustrating a result of the XPS analysis of the electron transporting layer that is performed when cesium zirconate is vapor-deposited using the electron beam method.

FIGS. 5 (a) and (b) are charts illustrating a result of the XPS analysis of the electron transporting layer that is performed when cesium zirconate is vapor-deposited using the resistant heating method.

FIGS. 6 (a) and (b) are charts illustrating a result of the XPS analysis of the electron transporting layer that is performed when cesium molybdate is vapor-deposited using the electron beam method.

FIGS. 7 (a) and (b) are charts illustrating a result of the XPS analysis of the electron transporting layer that is performed when cesium molybdate is vapor-deposited using the resistant heating method.

DESCRIPTION OF EMBODIMENTS

Embodiments of the present invention will be described below by referring to the drawings. Moreover, in all the drawings, the same constituent elements are given the same reference numerals, and descriptions thereof are suitably omitted.

Figure 1:
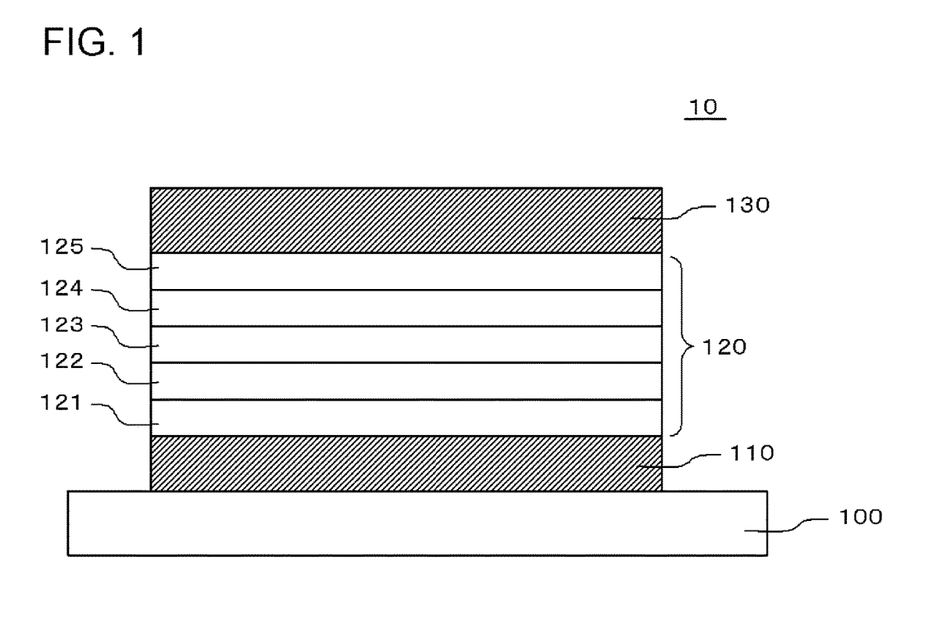
FIG. 1 is a diagram illustrating a configuration of a light emitting element according to an embodiment.

FIG. 1 is a diagram illustrating a configuration of a light emitting element 10 according to an embodiment. The light emitting element 10 according to the embodiment includes a first electrode 110, an organic layer 120, and a second electrode 130. The second electrode 130 is superimposed on the first electrode 110. The organic layer 120 is positioned between the first electrode 110 and the second electrode 130. The organic layer 120 includes a light emitting layer 123.

Furthermore, the organic layer 120 includes an alkali-containing layer (which is an electron transporting layer 125 in an example that is illustrated in the present drawing and hereinafter described as the electron transporting layer 125) between the light emitting layer 123 and the second electrode 130. The electron transporting layer 125 includes an alkali metal. In the electron transporting layer 125, the content of an alkali metal as an elemental substance or a content of a compound of the alkali metal that is a different from a first compound containing a transition metal is greater than the content of the first compound. Moreover, the content of the elemental alkali metal, the content of the compound of the alkali metal, and the content of the first compound can be measured, for example, using XPS.

The light emitting element 10 is used as a light source of a light emitting device. The light emitting device is, for example, a display or an illumination device. A detailed description will be provided below.

A substrate 100 is used for forming the light emitting element 10. The substrate 100 is, for example, a transparent substrate, such as a glass substrate or a resin substrate. The substrate 100 may have flexibility. In this case, the thickness of the substrate 100, for example, ranges from 10 μm to 10000 μm. In this case, the substrate 100 may also be formed of either an inorganic material or an organic material. The substrate 100, for example, is a polygon such as a rectangle.

The first electrode 110 functions, for example, as an anode of the light emitting element 10, and the second electrode 130 functions, for example, as a cathode of the light emitting element 10. One (first electrode 110 in the example illustrated in FIG. 1) of the first electrode 110 and the second electrode 130 is a transparent electrode that has optical transparency. Light that is emitted by the organic layer 120 propagates to the outside through an electrode (first electrode 110 in the example that is illustrated in FIG. 1) which is the transparent electrode between the first electrode 110 and the second electrode 130. A material of the transparent electrode, for example, includes an inorganic material, such as Indium Tin Oxide (ITO) or Indium Zinc Oxide (IZO), or a conductive polymer, such as a polythiophene derivative.

Furthermore, the other (second electrode 130 in the example that is illustrated in FIG. 1) of the first electrode 110 and the second electrode 130 includes a metal that is selected from a first group consisting of Al, Mg, Au, Ag, Pt, Sn, Zn, and In, or a metal layer that is made from an alloy of a metal that is selected from the first group.

The organic layer 120, as described above, is positioned between the first electrode 110 and the organic layer 120. The organic layer 120 has at least the light emitting layer 123 and the electron transporting layer 125. The electron transporting layer 125 may be an electron injection layer. In the example that is illustrated in FIG. 1, furthermore, a hole injection layer 121 and a hole transporting layer 122 are provided between the first electrode 110 and the light emitting layer 123, and a hole blocking layer 124 is provided between the light emitting layer 123 and the electron transporting layer 125. Moreover, at least one of the hole injection layer 121, the hole transporting layer 122, and the hole blocking layer 124 does not need to be provided. Furthermore, the electron injection layer may be provided between the electron transporting layer 125 and the second electrode 130.

The hole injection layer 121 is, for example, CuPc or $MoO_3$, and the hole transporting layer 122 is, for example, α-NPD. Furthermore, the hole blocking layer 124 is, for example, BAlq. Furthermore, the light emitting layer 123 is suitably selected according to a color of the light to be emitted by the light emitting element 10. The color of the light that is emitted by the light emitting element 10 is, for example, red, green, or blue, but may be a color other than these. These layers may be formed by a coating method, such as a printing method or an inkjet method, and may be formed using a vapor deposition method.

Moreover, the organic layer 120 may have multiple light emitting layers 123. In this situation, an intermediate layer may be formed between the light emitting layers 123. The intermediate layer is, for example, an organic layer, an inorganic layer, a mixed layer of the organic layer and the inorganic layer, or a laminated structure of these layers. In this case, the light emitting element 10 may emit white light.

The electron transporting layer 125 has a structure in which an alkali metal is included in an organic material, particularly, an electron-accepting organic semiconductor material (for example, NBphen). The alkali metal used here is, for example, Cs (cesium). However, an alkali metal other than Cs may be used. These alkali metals are metals that have an electron donating characteristic.

For example, in a case where the content of the alkali metal in the electron transporting layer 125 is defined based on a peak height of XPS, the content of the alkali metal ranges from 1% to 50%, preferably from 1% to 20%.

In the electron transporting layer 125, the content of an alkali metal as an elemental substance or the content of a compound of the alkali metal different from the first compound described above, is greater than the content of the first compound. Preferably, the content of the first compound is a detection limit or less (for example, a detection limit or less in XPS). Furthermore, it is preferable that the electron transporting layer 125 does not include an oxide of a metal of the first compound, for example, a metal (for example, a transition metal such as Ti, Zr, Mo, or W, particularly a metal of which an acid forms a salt with the alkali metal) other than the alkali metal described above (that is, the content of the metal is the detection limit or less). Furthermore, it is preferable that the electron transporting layer 125 does not include the transition metal (that is, the content of the metal is the detection limit or less), or that a detection value of the transition metal is one tenth or less (preferably one twentieth or less, more preferably one fiftieth or less) of a detection value of the alkali metal. The electron transporting layer 125 is formed using the vapor deposition method.

Moreover, in addition to the electron transporting layer 125, the organic layer 120 may have an electron transporting layer that has a different structure. In this case, this electron transporting layer may be positioned between the electron transporting layer 125 and the second electrode 130, and may be positioned between the hole blocking layer 124 and the electron transporting layer 125.

Next, a method of manufacturing the light emitting element 10 according to the embodiment is described. First, the first electrode 110 is formed on the substrate 100, for example, using the vapor deposition method, a sputtering method, or a CVD method. Subsequently, the organic layer 120 is formed on the first electrode 110. Then, the second electrode 130 is formed on the organic layer 120, for example, using the vapor deposition method or the sputtering method.

Moreover, the organic layer 120 is formed using the vapor deposition method or the coating method.

Furthermore, the electron transporting layer 125 is formed by vapor-depositing the alkali metal at the same time as vapor-depositing the organic material. The method of vapor-depositing the organic material, for example may be a resistant heating method, but other methods may be used.

On the other hand, as vapor deposition source of the alkali metal, for example, a salt of the alkali metal with an acid of a different metal is used. As the different metal, for example, Ti, Zr, W, or Mo as the transition metal is used, and Ti, Zr, or W is preferably used. As the vapor deposition method, the resistant heating method or an electron beam method is used. A structure of the alkali metal that is contained in the electron transporting layer 125 may have the structure described above by adjusting conditions during the vapor deposition. Moreover, in a case where the salt of the alkali metal with the acid of the transition metal is used as the vapor deposition source of the alkali metal, it is preferable that the resistant heating method is used.

Furthermore, in a case where the electron beam method is used for vapor deposition of the alkali metal, a compound (for example, cesium titanate) that changes by heating from a solid state to a liquid state and then vaporizes is preferable as the vapor deposition source of the alkali metal. When a compound (for example, cesium molybdate, cesium tungstate, or cesium zirconate) that directly vaporizes from the solid state is set to be the vapor deposition source, the cesium compound in the vapor deposition source that is present at a position irradiated by an electron beam, out of the entire vapor deposition source, decreases, and only a compound (a compound of the transitional metalpound different from the compound of the alkali metal) of the transmission metal which does not include cesium remains. In this situation, in some cases, it is difficult to vapor-deposit cesium. Furthermore, in some cases, the transition metal compound (the transition metal compound that is different from the alkali metal compound) is vapor-deposited by the irradiation with the electron beam, and is mixed into the organic layer 120 as a foreign material that becomes a cause of degradation of the light emitting element (the organic EL element). In contrast, if the cesium compound (for example, cesium titanate) that is liquefied by heating is used, a flow of the cesium compound causes an inflow of the cesium compound into the position of the vapor deposition source which is irradiated with the electron beam. Accordingly, cesium can be continuously vapor-deposited.

According to the present embodiment, the alkali metal is included in the electron transporting layer 125. In the electron transporting layer 125, the content of the alkali metal as an elemental substance (or the content of a compound other than the first compound described above, among alkali metal compounds) is greater than the content of the first compound described above. For this reason, the electron donating characteristic within the electron transporting layer by the alkali metal can be improved and a drive voltage of the light emitting element 10 can be lowered. Furthermore, light emitting efficiency of the light emitting element 10 is also improved. Here, the drive voltage of the light emitting element 10 can be lowered even when a sum of the content of the alkali metal as an elemental substance and the content of the compound other than the first compound described above, among the alkali metal compounds, is greater than the content of the first compound described above.

EXAMPLES

The light emitting element 10 that is illustrated in FIG. 1 was produced. Glass was used as the substrate 100. An ITO with a thickness of 110 nm was used as the first electrode 110, and CuPc with a thickness of 20 nm was used as the hole injection layer 121. α-NPD with a thickness of 40 nm was used as the hole transporting layer 122. CBP:Ir(ppy)$_3$ (9 Vol %) was used as the light emitting layer 123, and BAlq with a thickness of 10 nm was used as the hole blocking layer 124. Additionally, Ag with a thickness of 100 nm was used as the second electrode 130.

Furthermore, the thickness of the electron transporting layer 125 was set to 50 nm. NBpen was used as an organic material that constituted the electron transporting layer 125. As the vapor deposition source of the alkali metal, cesium titanate, cesium zirconate, cesium molybdate, and cesium tungstate were used. Finally, as the vapor deposition method, the resistant heating method and an electron beam vapor deposition method were used.

Figure 2:
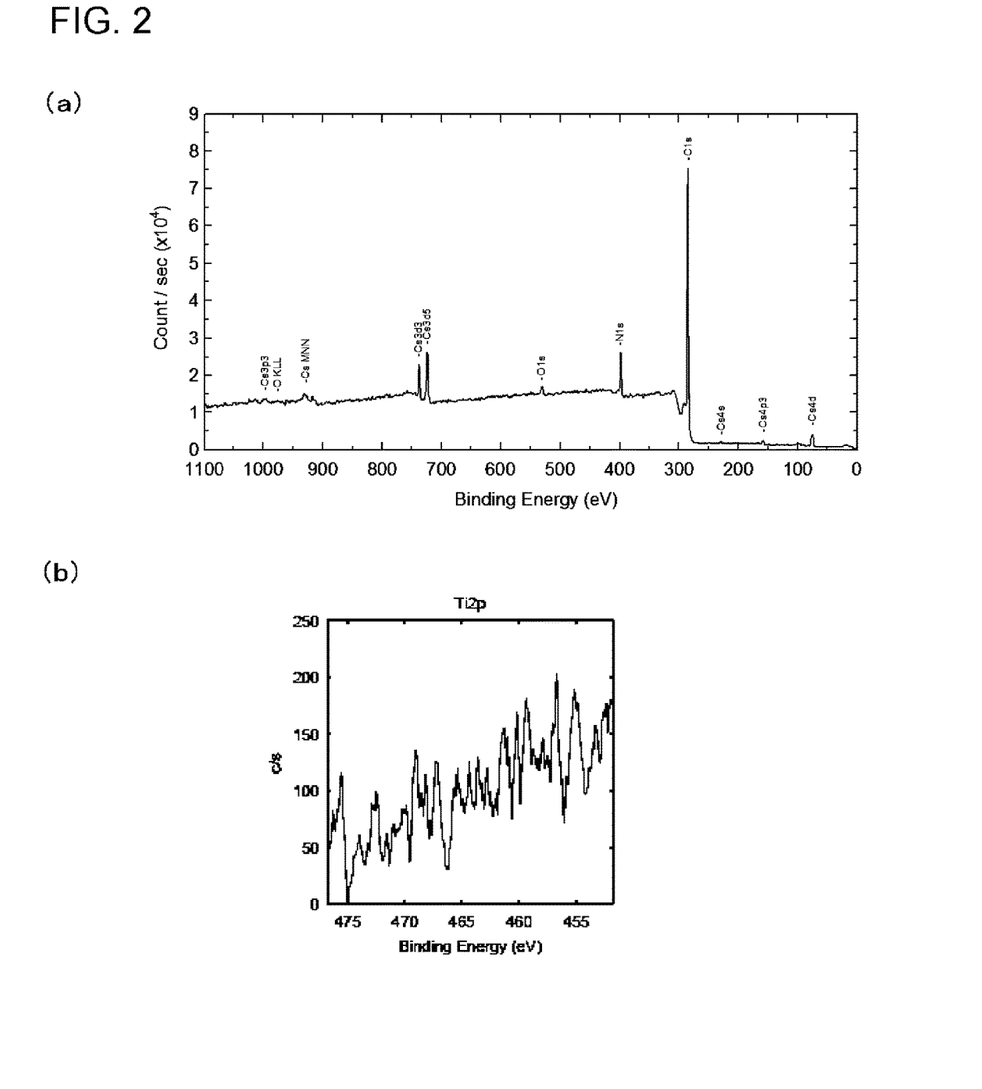
Figure 3:
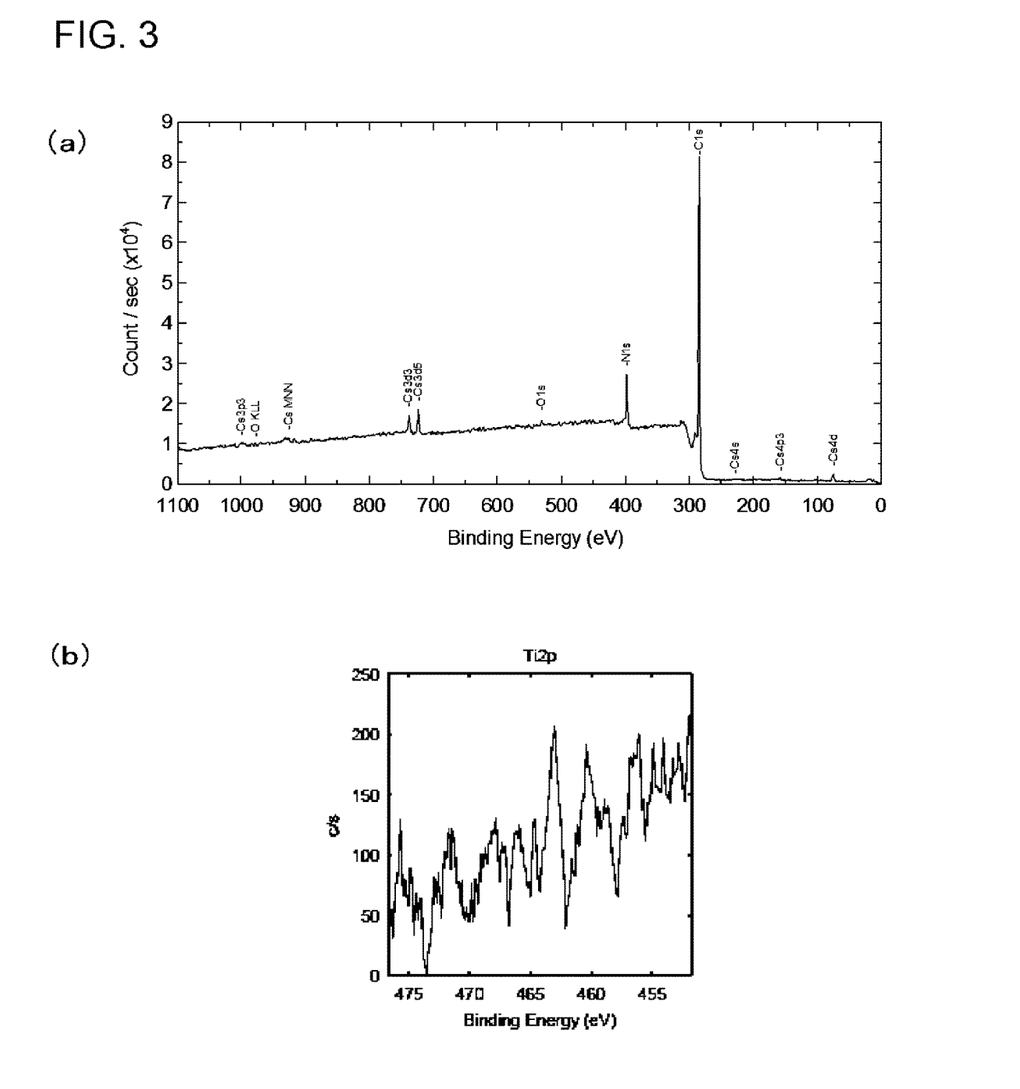

FIG. 2 are charts illustrating a result of an XPS analysis of the electron transporting layer 125 that was performed when cesium titanate was vapor-deposited using the electron beam method. FIG. 3 are charts illustrating a result of the XPS analysis of the electron transporting layer 125 that was performed when cesium titanate was vapor-deposited using the resistant heating method. From these charts, when cesium titanate was used as the vapor deposition source, peaks resulting from Cs were observed, but peaks (for example, 458.6 eV to 459.3 eV in the case of TiO$_2$2p3/2) resulting from Ti were hardly observed. Further, (peak resulting from Cs3d)/(peak resulting from Ti2P) was 3 to 30 times when the resistant heating method was used, and was 5 to 70 times when the electron beam method was used.

Figure 4:
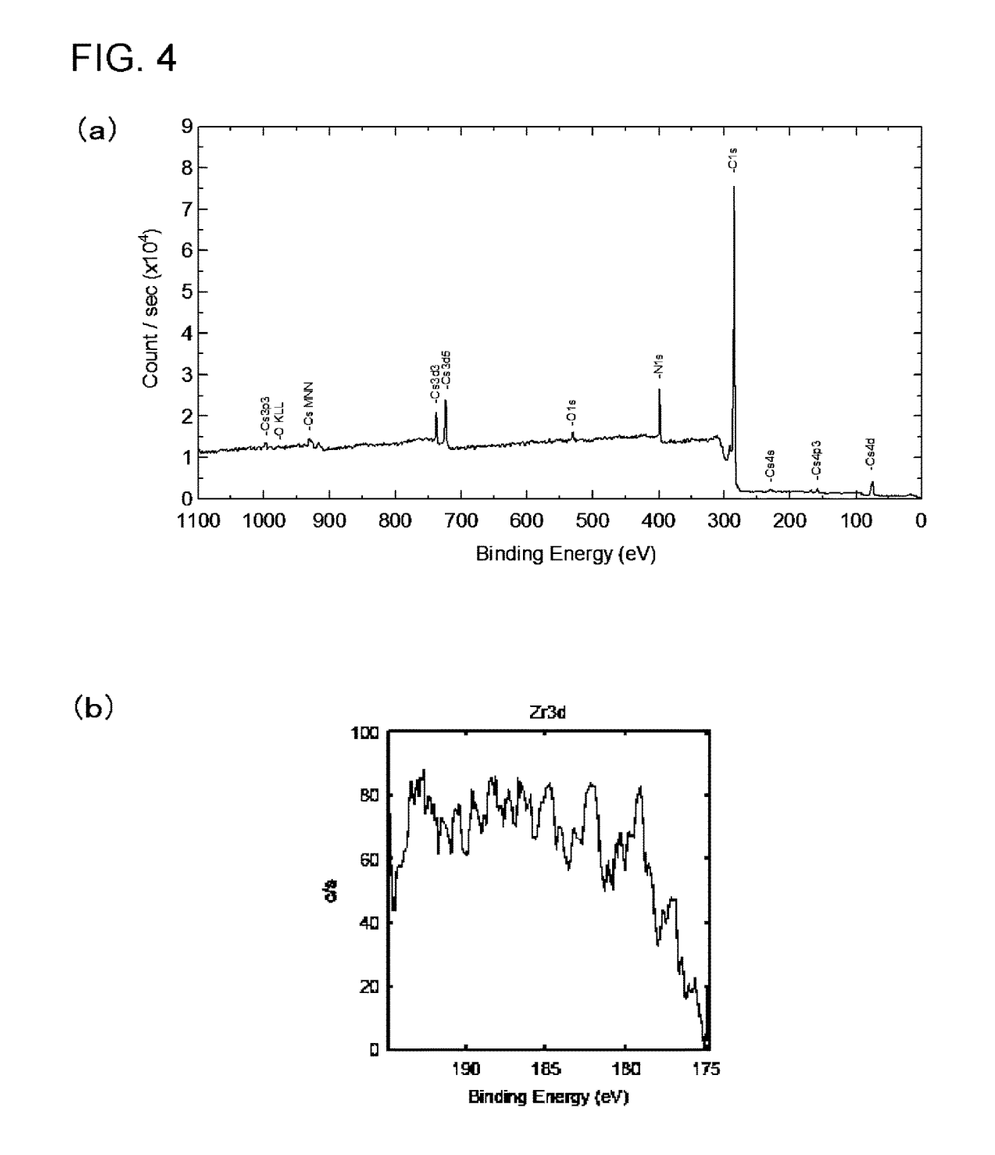
Figure 5:
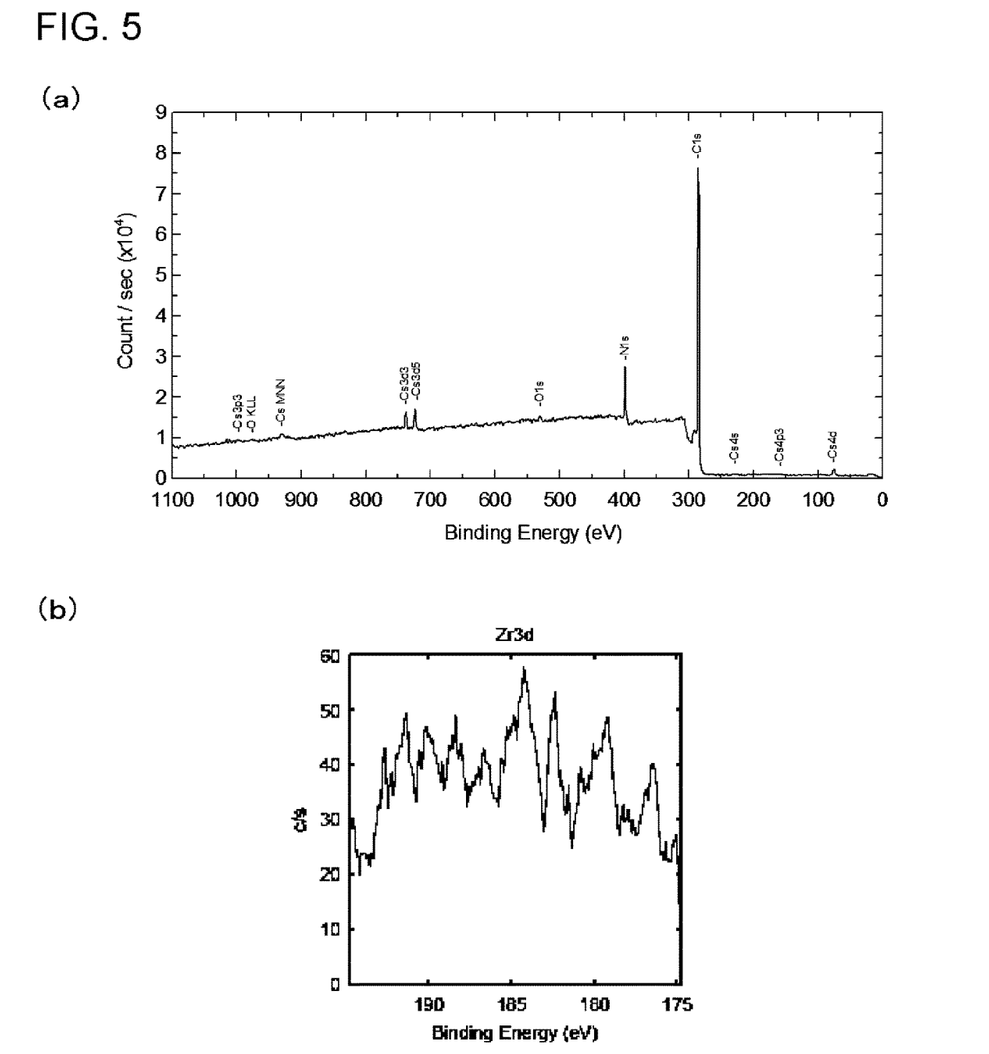

FIG. 4 are charts illustrating a result of the XPS analysis of the electron transporting layer 125 that was performed when cesium zirconate was vapor-deposited using the electron beam method. FIG. 5 are charts illustrating a result of the XPS analysis of the electron transporting layer 125 that was performed when cesium zirconate was vapor-deposited using the resistant heating method. From these charts, when cesium zirconate was used as the vapor deposition source, peaks resulting from Cs were observed, but peaks (for example, 182.0 eV to 182.5 eV in the case of ZrO$_2$) resulting from Zr were hardly observed. Further, (peak resulting from Cs3d)/(peak resulting from Zr3d) was 70 to 90 times when the resistant heating method was used, and was 120 to 170 times when the electron beam method was used.

Figure 6:
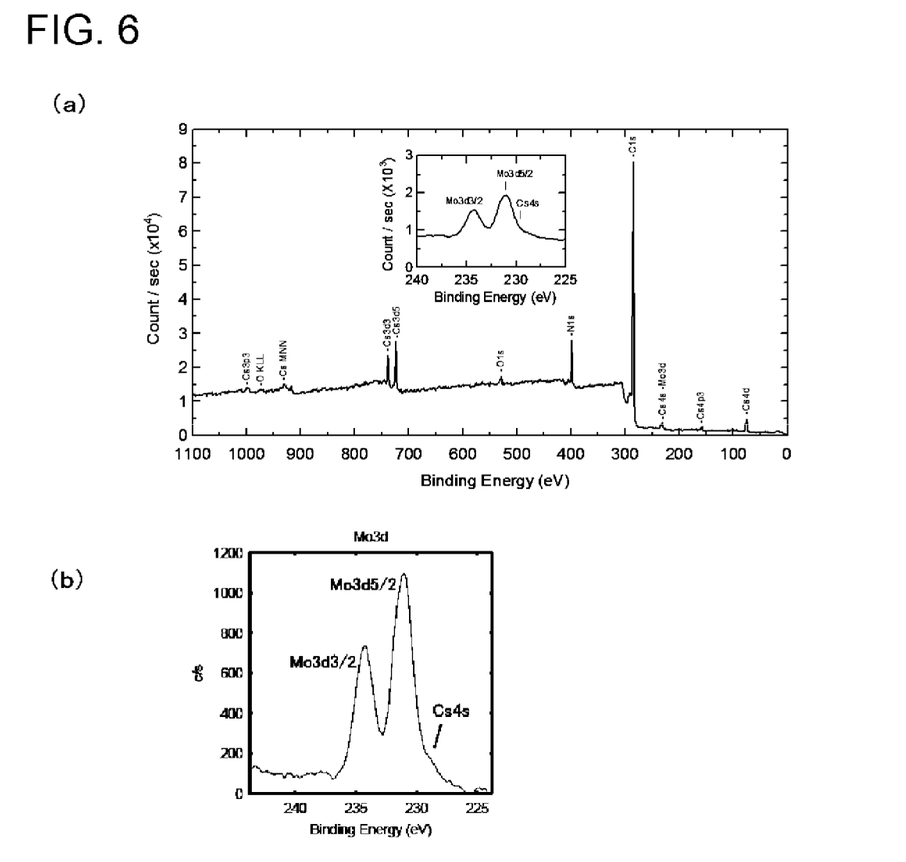
Figure 7:
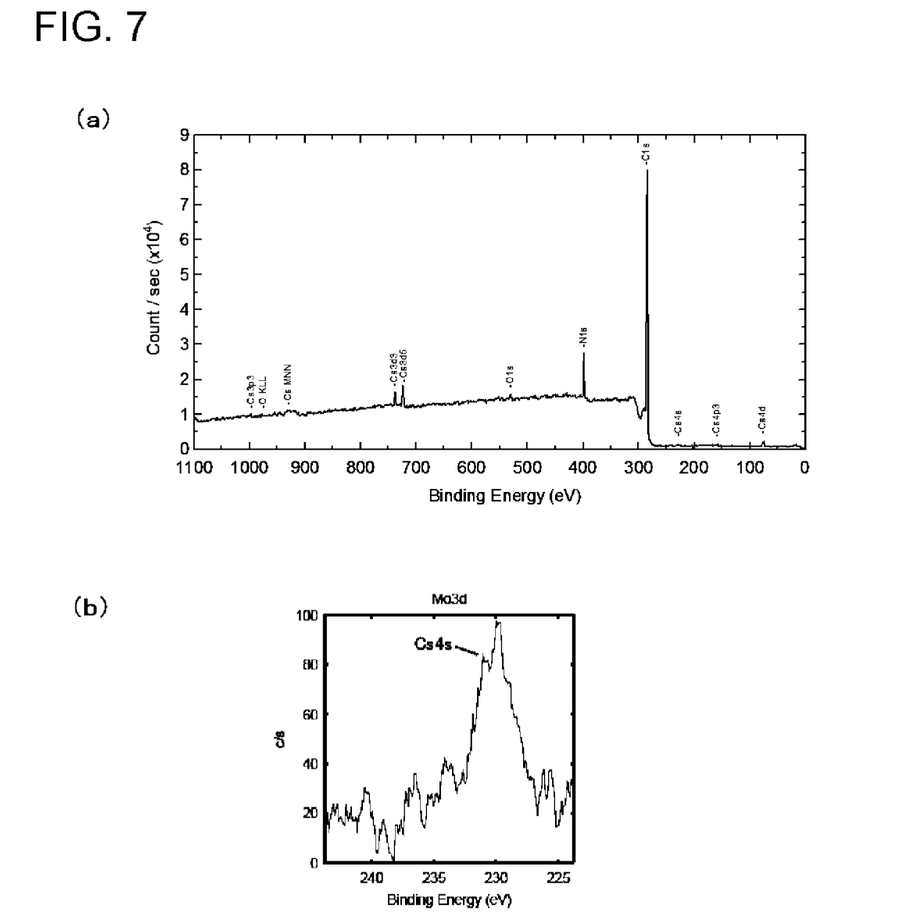

FIG. 6 are charts illustrating a result of the XPS analysis of the electron transporting layer 125 that was performed when cesium molybdate was vapor-deposited using the electron beam method. FIG. 7 are charts illustrating a result of the XPS analysis of the electron transporting layer 125 that was performed when cesium molybdate was vapor-deposited using the resistant heating method. As illustrated in FIG. 6, in a case where cesium molybdate was used as the vapor deposition source, when the vapor deposition was performed using the electron beam method, peaks resulting from Cs as an elemental substance was observed and in addition, peaks (for example, 235 eV to 240 eV) resulting from Mo were also observed. Further, (peak resulting from Cs3d)/(peak resulting from Mo3d) was 5 to 15 times.

On the other hand, as illustrated in FIG. 7, when cesium molybdate was vapor-deposited as the vapor deposition source using the resistant heating method, peaks resulting from Cs were observed, but peaks (for example, 235 eV to 240 eV) resulting from Mo were also observed.

Figure 8:
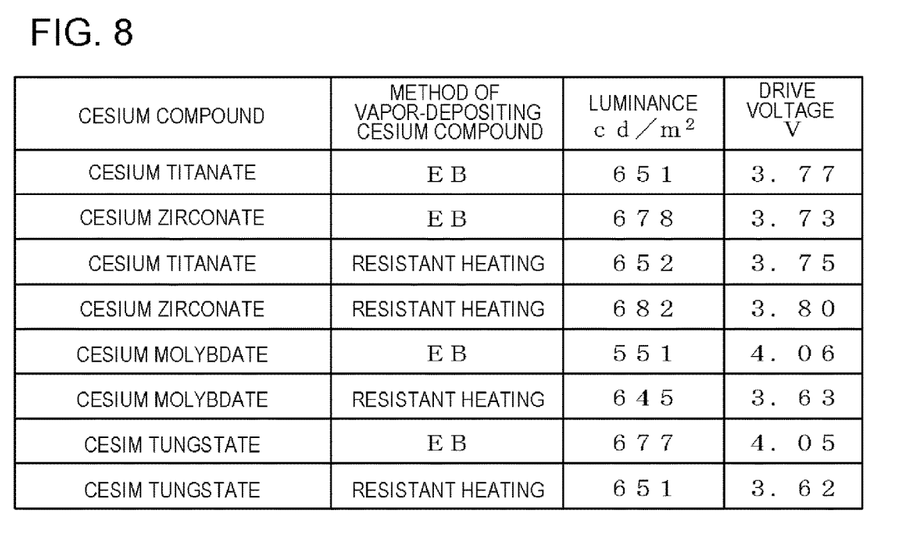
FIG. 8 is a chart illustrating luminance and a drive voltage of each specimen.

FIG. 8 illustrates luminance and a drive voltage of each specimen. Each drive current was set to 2.5 mA/cm$^2$. As described above, in a case where cesium molybdate was used as the vapor deposition source, when the vapor deposition was performed using the electron beam (EB) method, Mo was included in the electron transporting layer 125. For this reason, the drive voltage of this specimen increased and the luminance of this specimen decreased. In a case where cesium tungstate was used as the vapor deposition source and the vapor deposition was performed using the electron beam method, the drive voltage also increased. It is considered that this was also because W was included in the electron transporting layer 125.

Furthermore, when the vapor deposition was performed using the electron beam method, and in a case where cesium zirconate or cesium titanate was used as the vapor deposition source, no change in properties of the vapor deposition source was observed, but when cesium molybdate or cesium tungstate was used as the vapor deposition source, the vapor deposition source was discolored blackish.

As described above, it can be said that, when the content of an alkali metal compound in the electron transporting layer 125 is small, the light emitting efficiency of the light emitting element 10 is improved and thus the luminance thereof is increased. Furthermore, it can be said that, when the content of a metal that constitutes the salt with the alkali metal in the electron transporting layer 125 is small, the light emitting efficiency of the light emitting element 10 is improved and thus the luminance thereof is increased. Further, it can be said that, when the vapor deposition is performed using the electron beam method, cesium zirconate or cesium titanate is suitable as the vapor deposition source, but cesium molybdate or cesium tungstate is not suitable.

Moreover, when the electron transporting layer 125 is formed using the resistant heating method, an amount of radiant heat increases. When the size of the substrate 100 increases, because a distance between the substrate 100 and the vapor deposition source increases as well, the amount of radiant heat further increases. In a case where the amount of radiant heat is high, there is concern that the temperature of the organic layer 120 that is already formed on the substrate 100 may increase, thus inviting a risk of the organic layer changing in its properties. Furthermore, there is concern that a mask at the time of the vapor deposition may become thermally expanded, thus becoming deformed. However, such problems as the above hardly occur when the electron transporting layer 125 is vapor-deposited using the electron beam method.

The embodiment and the examples are described above referring to the drawings, but these are examples of the present invention and various configurations other than those described above can be employed.

The invention claimed is:

1. A method of manufacturing a light emitting element, comprising:
    forming a first electrode on a substrate;
    forming an organic layer including a light emitting layer on the first electrode; and
    forming a second electrode on the organic layer,
    wherein the organic layer includes the light emitting layer and an alkali-containing layer between the light emitting layer and the second electrode,
    wherein the alkali-containing layer contains an alkali metal and an organic material, and is formed by electron beam vapor deposition, and
    wherein a material of the electron beam vapor deposition comprises a salt of the alkali metal and an acid of a different metal than the alkali metal.

2. The method of manufacturing a light emitting element of claim 1, wherein the salt is a cesium compound.

3. The method of manufacturing a light emitting element of claim 2,
    wherein the cesium compound, when heated, liquefies and evaporates.

4. The method of manufacturing a light emitting element of claim 3,
    wherein the cesium compound is cesium titanate.

\* \* \* \* \*